United States Patent [19]
Ekeland

[11] 3,953,846
[45] Apr. 27, 1976

[54] ENCODING DEVICE
[76] Inventor: Thomas C. Ekeland, 45 John St., New York, N.Y. 10038
[22] Filed: Apr. 10, 1975
[21] Appl. No.: 566,756

Related U.S. Application Data
[63] Continuation-in-part of Ser. No. 413,055, Nov. 5, 1973, abandoned.

[52] U.S. Cl............................... 340/337; 235/154; 340/347 DD; 340/365 S
[51] Int. Cl.²......................................... G08B 5/36
[58] Field of Search........................ 340/337, 365 S; 235/154; 179/1 SP; 444/1

[56] References Cited
UNITED STATES PATENTS
| | | | |
|---|---|---|---|
| 3,122,734 | 2/1964 | Rice................................. | 340/365 S |
| 3,689,915 | 9/1972 | DeClerck et al. ............... | 340/365 S |
| 3,727,327 | 4/1973 | Ekeland............................ | 35/24 |

*Primary Examiner*—David L. Trafton
*Attorney, Agent, or Firm*—Charles E. Temko

[57] ABSTRACT

A keyboard-operated encoding device for use in translating an alphabetic word into an alpha-numeric code in which the word or name is divided into phonic sounds, and assigned a digital number in accordance with a pre-established pattern classifying the phonic sounds by the manner in which they are vocally pronounced. The obtained code is subsequently applied to a file envelope or wrapper in accordance with said pattern. The device is particularly suited for encoding names in accordance with the disclosure in U.S. Pat. No. 3,727,327, dated Apr. 17, 1973, but may also be used for general word encoding purposes. Means is provided to take into account and adjudge the several components of a name in order to take advantage of every available code position in a predetermined maximum number of code digits to reflect in the resultant code each component of a name, upon actuation of a comma key and space bar.

2 Claims, 7 Drawing Figures

ENCODING DEVICE

This application is a continuation in part of my co-pending application Ser. No. 413,055 filed Nov. 5, 1973 under the same title, now abandoned.

BACKGROUND OF THE INVENTION

This invention relates generally to the field of numerical encoding devices, and more particularly to an alpha-numerical encoder suitable for use, inter alia, in mechanically implementing the encoding of names for filing and retrieval purposes, as set forth in my above mentioned patent. By means of the device, a filing code is formed by dividing the name or word to be encoded into phonic sounds, assigning a numeric number to the sounds in accordance with a preestablished pattern classifying the phonic sounds by the manner in which they are vocally produced, and filing the coded item in accordance with the assigned digital numbers.

BRIEF DESCRIPTION OF THE PRIOR ART

My above mentioned U.S. Pat. No. 3,727,327 teaches the use of the above described code as a series of mental steps. The Schmidt U.S. Pat. No. 1,305,939 discloses an alpha-numeric system using the first letter of the encoded word, and the assignment of one of ten digits to cover any of a group of adjacent characters. It requires the use of a chart for encoding, and each letter is assigned a numeric character which in part depends upon the identification of the previous letter in a word. The Wagner U.S. Pat. No. 1,685,206, teaches an equally complex system. It is possible to accomplish encoding by programming standard computers, but such computers are more expensive than warranted, and for the most part are nonportable. Further, in many cases, they require a tape punching or similar operation which is time consuming, and the output, if the computer is used on a time share basis, is not always immediately available. The De Clerck U.S. Pat. No. 3,689,915 discloses an encoding circuit for retrieval apparatus wherein retrieval or access phrases are entered via an alpha-numeric keyboard which converts each character into an M bit binary code. However, the operation of this system requires knowledge of a complete name or phrase, since knowledge and insertion of only a portion of a complete name or phrase will result in an entirely different and unrelated code compared to that obtained using full information.

BRIEF DESCRIPTION OF THE PRESENT INVENTION

Briefly stated, the invention contemplates the provision of a special purpose small-sized portable encoding device having a quasi-standard typewriter keyboard input means, and means for encoding the standard alphabet in accordance with predetermined groups of consonants, corresponding to the type of sound vocally produced upon pronunciation, as for example plosive, rear palate, labial, nasal, fricative, sibilant, etc. Circuitry is provided for utilizing the vowels and impulses from the space bar for spacing and grouping functions, as well as determining the length of given code words. A light-emitting diode display may be positioned in the location normally occupied by a platten above the typewriter keyboard. Thus, by merely typing the name or word to be encoded, the resultant code word appears in the display for immediate use by a filing clerk. Not only can a suitable label be immediately prepared by the clerk, but the code necessary for file search can be immediately obtained upon being provided with the name of an individual, or other pertinent information. The present state of the electronic computer art permits the use of many standardized integrated circuits of known type for performing the usual logic processing functions. Means is provided to take into account and adjudge the several components of a name in order to take advantage of every available code position in a predetermined maximum number of code digits to reflect in the resultant code each component of the name, upon actuation of the comma key and space bar.

BRIEF DESCRIPTION OF THE DRAWINGS

In the drawings, to which reference will be made in the specification.

DETAILED DESCRIPTION OF THE DISCLOSED EMBODIMENT

Figures 1, 2D:
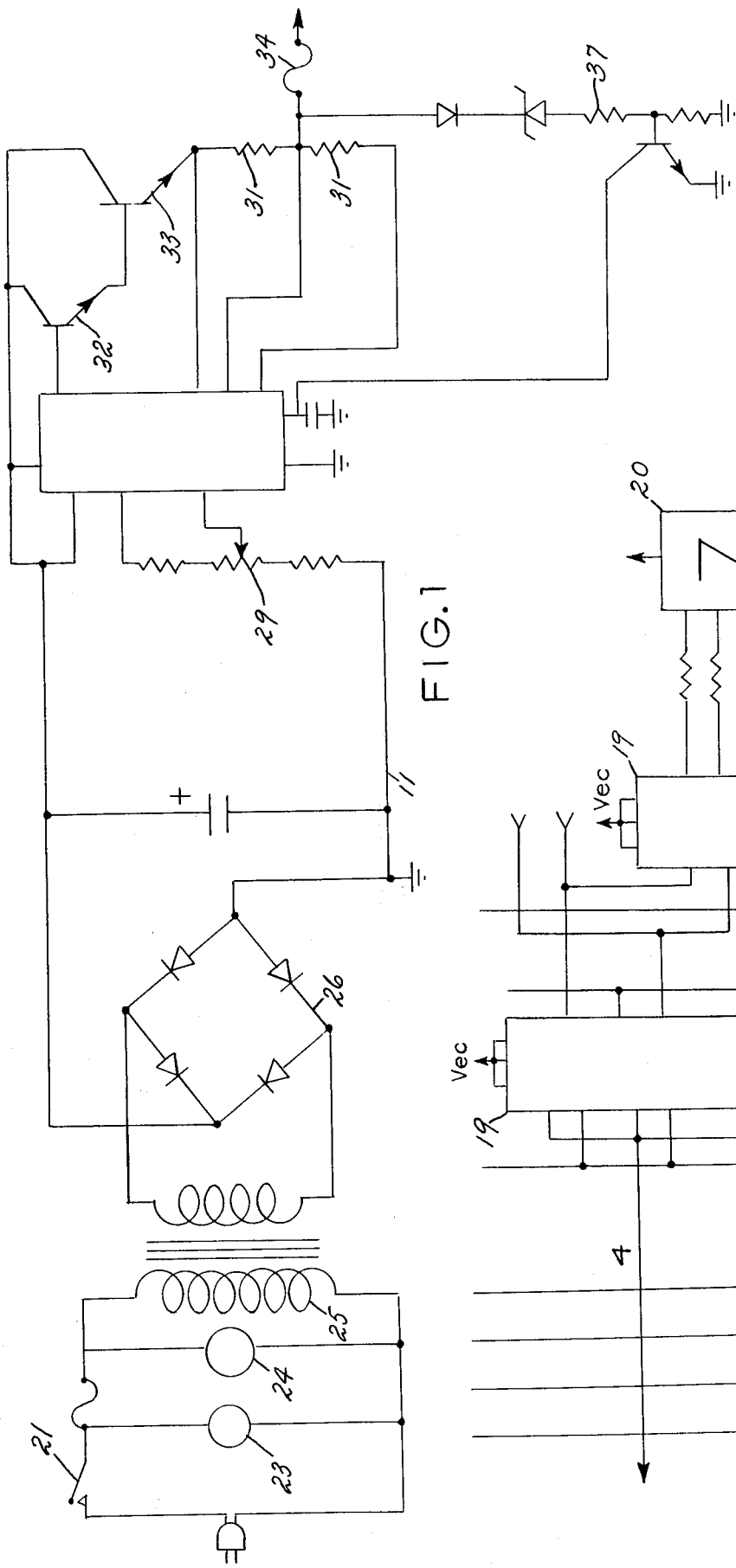
FIG. 1 is a schematic diagram of a power supply of an encoding device embodying the invention.
FIGS. 2a, 2b, 2c and 2d are a schematic drawing of the remaining components of the embodiment.

In accordance with the invention, the device, generally indicated by reference character 10, comprises broadly: a power supply element 11, a keyboard element 12, a double key display element 13, a decimal to binary converter element 14, a logic signal generator element 15, a temporary storage element 16, a signal delay element 17, a digit control element 18, a decoder-driver element 19 and a display element 20.

The power supply element 11 is illustrated in FIG. 1 in the drawing, and is adapted to be operated from 100–125 volt alternating current. A switch 21 activates a 110 volt A.C. input causing a neon pilot light 23 to illuminate. A variator 24 is connected in parallel with a transformer primary winding 25 for primary power transient overvoltage protection. The transformer steps down the primary voltage to 14 volts which is rectified by a full wave rectifier 26, output of which flows to a voltage regulator 29. Current sensing resistors 31 sense current to provide current limiting during overload conditions. Regulation is provided by the pass transistors 32 and 33 and the output is through a fuse 34 to the logic circuits and keyboard element 12. Reference character 37 designates a crowbar voltage limiter of known type.

Figure 2A:
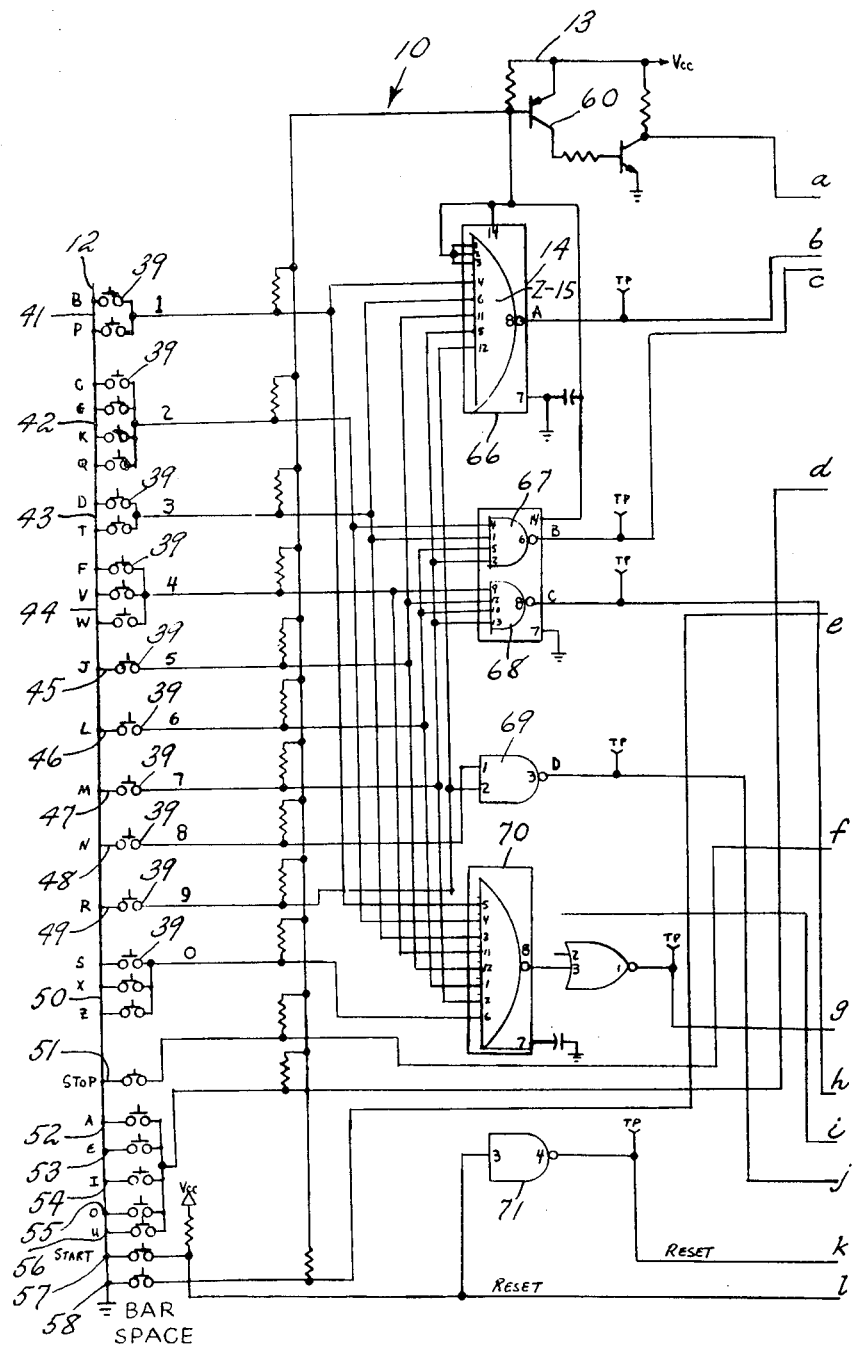
Figure 2B:
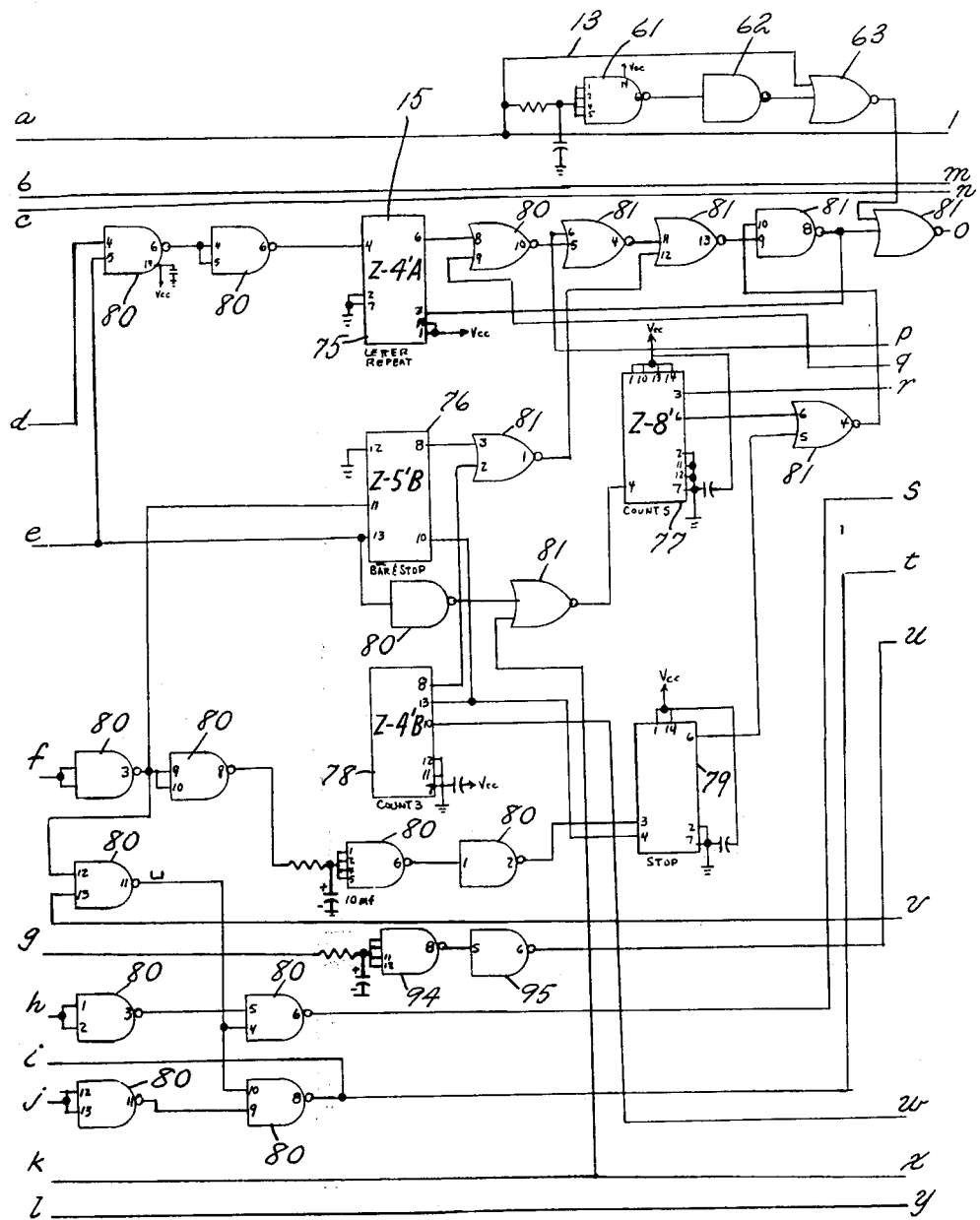
Figure 2C:
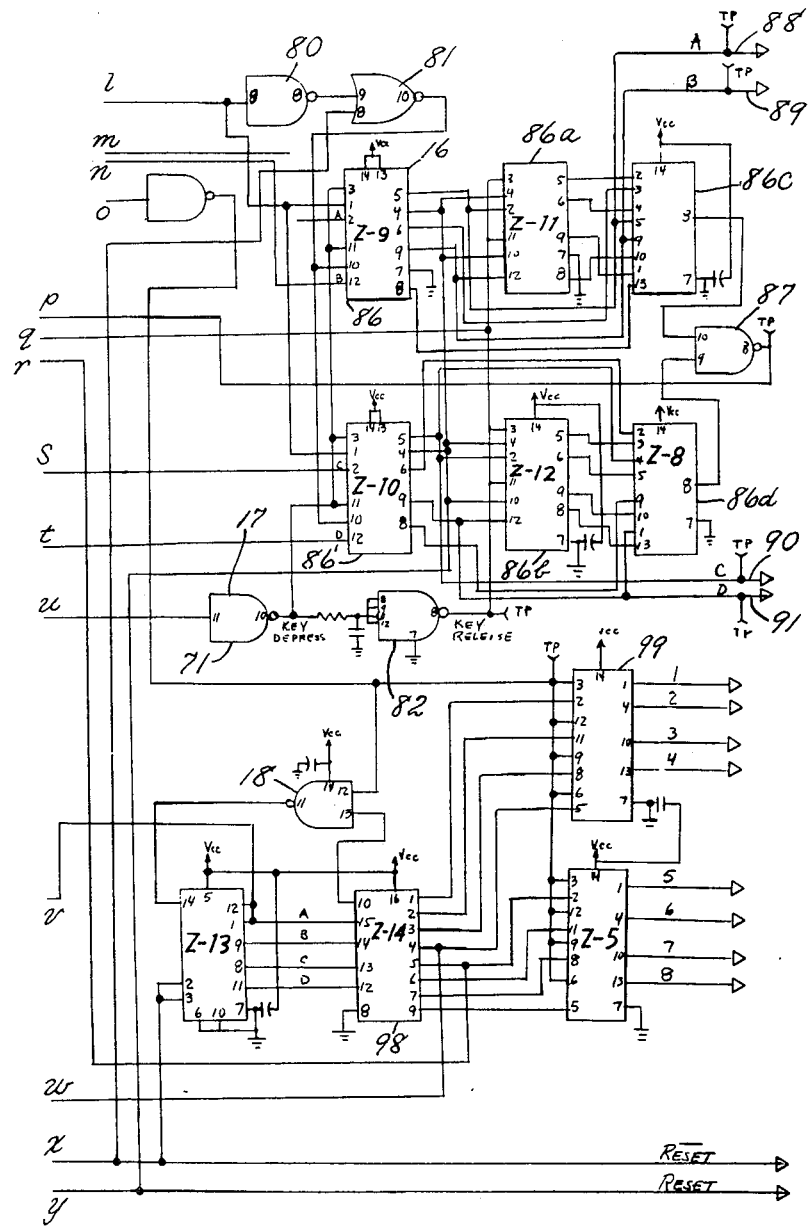

Referring to FIG. 2a, the keyboard element 12 includes a quasi-standard typewriter keyboard which includes the entire alphabet, the keys being connected to corresponding switches 39. Although the keys may be positioned in conventional mutual relation, they are electronically grouped in sets of one or more keys, as indicated by reference characters 41, 42, 43, 44, 45, 46, 47, 48, 49, and 50. Set 41 includes the letters B and P, which comprise the plosive sounds. Set 42 includes the rear palate sounds G, C, K, and Q. Set 43 includes the front palate sounds D and T. Set 44 includes the fricatives F, V and W. The sets 45–49, inclusive, each include a single consonant, namely J, L, M, N, and R, respectively. Set 50 includes the sibilants S, X, and Z. Stop key 51 serves to indicate the end of a word group being encoded.

Vowel sets 52, 53, 54, 55 and 56 correspond to the vowels A, E, H, I, O, U and Y, respectively. These keys as will more fully appear are not assigned a numeric symbol, but serve to enable double letter restrictive circuitry. A start key 57 serves to initiate a spacing function, as with the vowel sets 52–56.

The double key display element 13 serves the purpose of indicating by an error symbol on the output display that two keys have been simultaneously depressed, and advising the operator to commence the insertion of the word to be encoded a second time. It includes a small current sense amplifier circuit 60, a series of gates 61, 62 and 63, and generates the error symbol on the digit display which would have received the correct code if only one key were depressed. This circuit is known in the art as an N key rollover, and as its operation is well known, it need not be further considered in the present disclosure.

The decimal to binary converter element 14 includes a plurality of AND gates 66, 67, 68, 69 and 70, and a NOR gate 71. Decimal is converted to four bit binary, the binary code employed being usually referred to as the 8421 or BCD code. Included in this subcircuit is the generation of the reset signal which clears all displays, and resets the flip-flops in the storage element 16 to ones, to start the generation of a new code word.

The transfer clock logic signal generator element 15 is controlled by the vowel sets 52–56, the start key 57, the stop key 51 and the bar space 58. It includes a letter repeater integrated circuit 75, a bar and stop circuit 76, a 5 count memory 77, a 3 count memory 78, a stop circuit 79, 13 AND gates 80 and six OR gates 81.

The temporary storage element 16 is generally conventional, and includes six storage registers 86 and an AND gate 87. Output lines 88, 89, 90 and 91 carry the four bits of the four bit code.

The signal delay element 17 includes the NOR gates 71 and 82 and the gates 94 and 95. The NOR gates generate the key depressed signal, the signal being delayed by a Schmidt trigger to enter keyboard data into storage after key bounce has subsided. The element is also used to delay the depressed key signal to transfer data between storage registers.

The digit control element 18 keeps track of which display has data already entered into it, and cycles the following data to the next display. It consists of a decode counter and a BCD to one of ten line decoder. The decoder controls the NOR gates which gate the transfer clock signal to the selected display storage registers. The decoder elements are also used to set the count of 3 and count of 5 memory elements mentioned above.

The decoder-driver element 19 decodes BCD information stored in the display storage registers to seven segment format and switches the necessary currents for illumination of the light-emitting diode seven segment displays of well known type.

OPERATION

A typical encoding operation is commenced by pressing the start key 57 which clears the storage registers and display. Assume that the name to be coded is SMITH, JOHN. Depress the typewriter key "S" and then the start key 57. Continue to type the whole name including the comma and space between the last and first names.

After the first letter of the last name has been entered and cleared, the remainder of the letters are processed functionally by the electronics in accordance with the established code. Electrically, as a letter is coded, it follows the electrical path described below.

Assume continuous encoding of the name SMITH, JOHN. The first letter to be coded is "M". Depressing the "M" key generates a four bit binary code at the output of integrated circuits 66, 67, 68, 69 and 86. These are represented by the A, B, C, and D bits of the four bit code. Electrically, A equals 1, B equals 1, C equals 1, and D equals zero. A one is plus five volts and a zero is zero volts. Thus, the binary code of the letter M equals 1110. A strobe or clock pulse is generated simultaneously by integrated circuits 70 and 94. This clock pulse is delayed a finite amount of time to allow the A, B, C and D outputs to stabilize. This clock pulse transfers the A, B, C and D outputs into temporary storage in integrated circuits 86 and 86' on the leading edge and transfers the contents of 86 and 86' to integrated circuits 86a and 86b on the trailing edge. When the integrated circuits 86c or 86d detect a difference between circuits 86 and 86a, and 86' and 86b, a write pulse is generated which transfers the contents of 86 and 86' into the display memory selected by the digit control element 18. The trailing edge of the write pulse is used to advance the digit control counter 78 one position for each write pulse received. Integrated circuits 98, 76 and 99 decode the digit control counter and control the selection of the display memory digit. Integrated circuits 19 display the contents of their respective memories on the light emitting displays.

Figure 3:
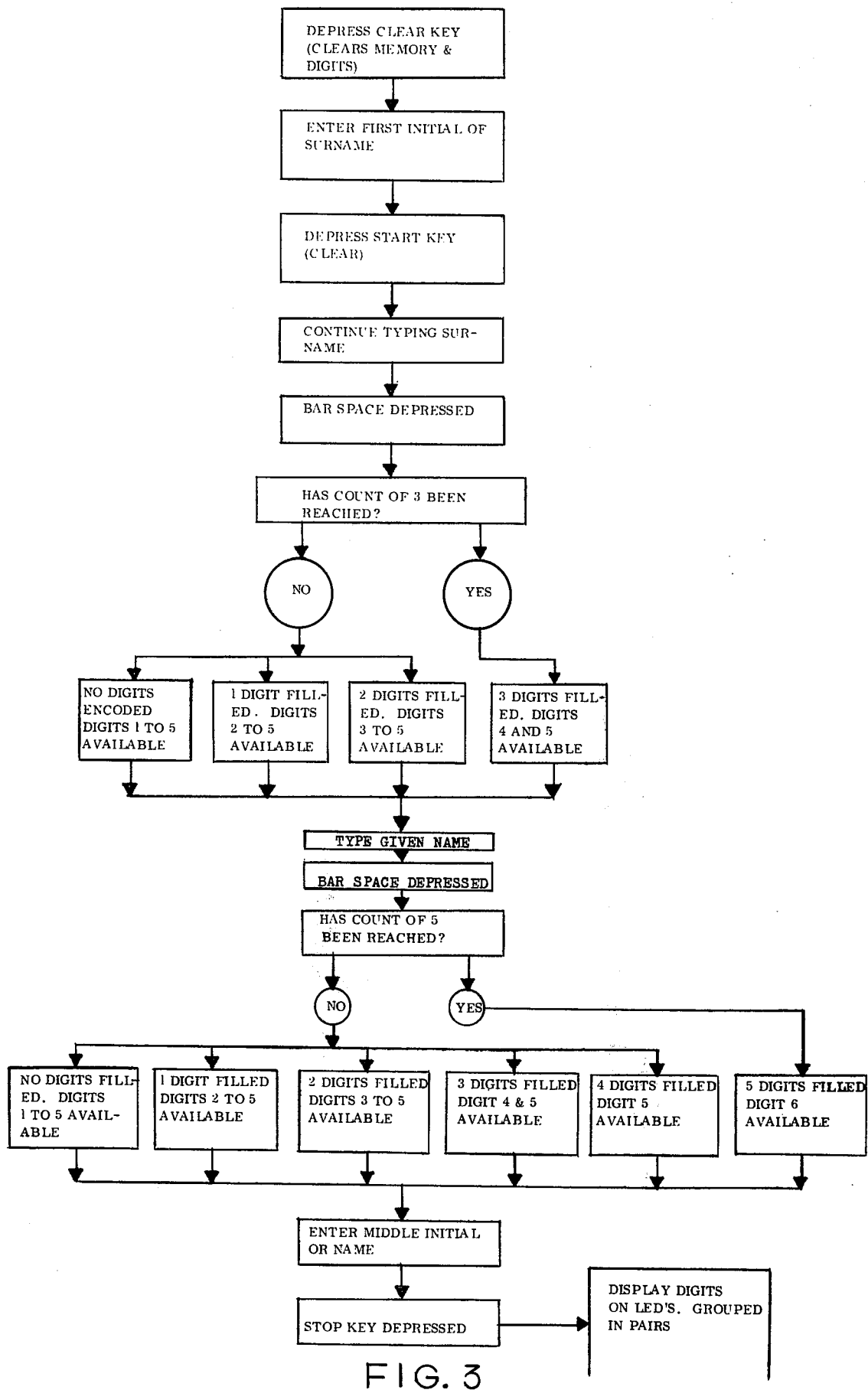
FIG. 3 is a functional flow diagram showing operation of the embodiment.
Figure 4:
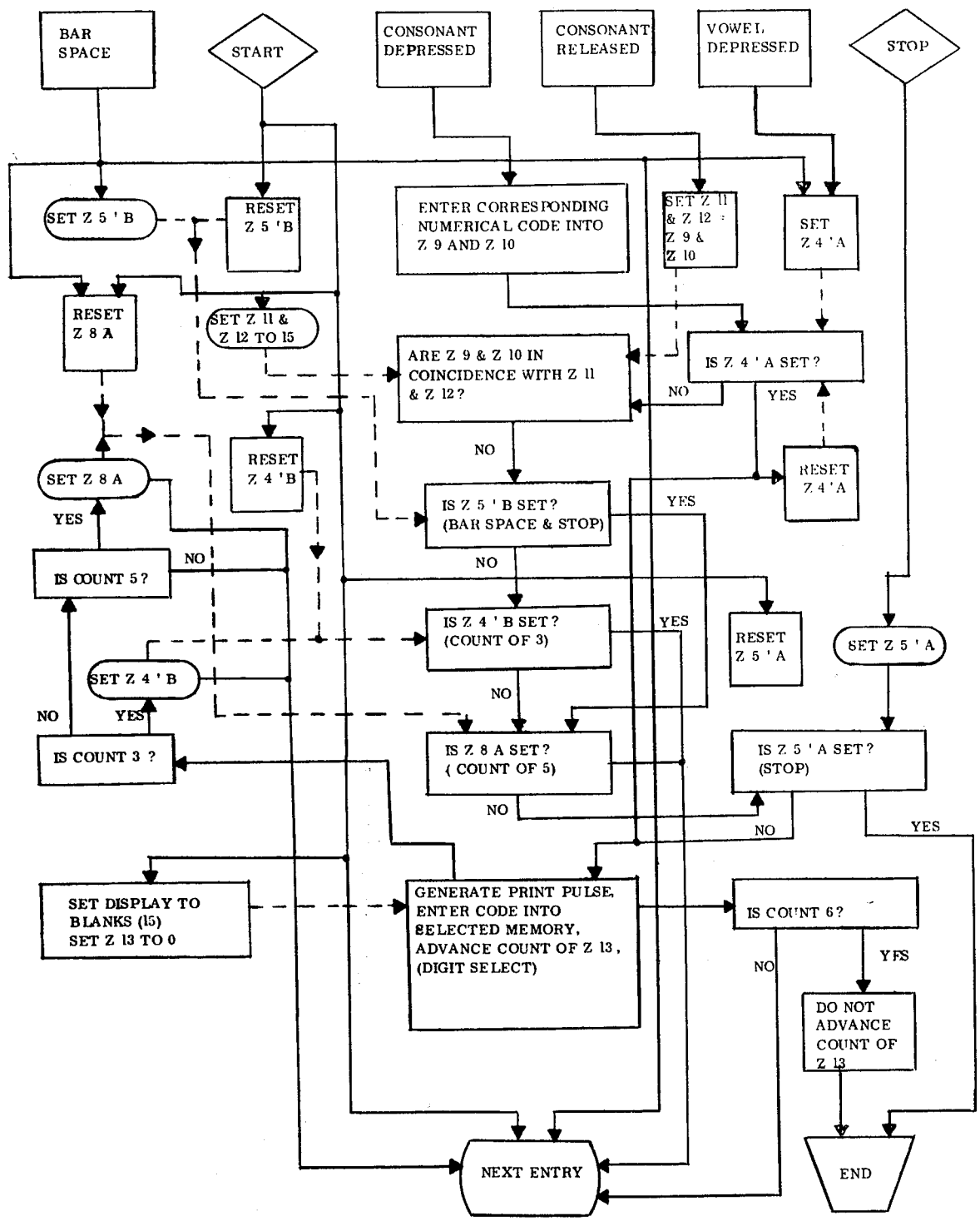
FIG. 4 is a logic flow diagram of the operation of the embodiment.

References is made to FIGS. 3 and 4 which comprise function and logic schematic diagrams whereby the code obtained will vary in length depending upon the completeness of the available information with respect to first, middle and last names of a given insertion to be encoded.

It will be noted that the disclosed device is capable of producing not only a unique code for each distinct insertion, but one in which the degree of uniqueness is determined by the amount of available information relative to a given name insertion. Irrespective of the knowledge of the individual components (granted that the surname is known), a code will be produced to a maximum number of six digits which will enable a file to be placed in a proper storage area. To obtain this, the disclosed device takes into account and adjudges the several components of a name in order to take advantage of every available code position to reflect in the resultant code each component of the name. The device makes determinations upon activation of the comma key and space bar.

In the translation of alphabetic names to numerics, name insertions, i.e. surname, given name or initial, and middle name or initial, are treated as a single entity. In accordance with the method of my above mentioned prior U.S. Pat. No. 3,727,327, further uniqueness of numbers and obtaining the best frequency distribution of primary numbers is obtained by ignoring in translation the first letter of the surname.

In treating the entire name as a single entity, and because the disclosed mode of operation deals with sounds and does not give credence to silent letters, vowels and letters such as "Y" which often assumes the place of a vowel, the derived numeric translation achieves a certain uniqueness of number. In other words, the sequence of sounds in two different component names would have to be identical to achieve the same number.

Because of the difficulty of manually handling more than six digits in a code when the same is employed for manual retrieval of a file, for example, this number is employed as a maximum number in the code. There is no minimum number. In order to give recognition to each of the three components of a full name, the encoding process discriminates between surname, given name and middle name in order to have each component represented in the resultant numeric code. In so doing, therefore, a long surname cannot be accorded digital codes to the exclusion of a given name and middle name. For example, the name "Trandopholus", would generate by itself a six digit code, leaving no room for recognition of component names.

Discrimination is accomplished by activation of the comma key and space bar, whereby automatic determination is made as to how many numeric code digits may be accorded to each component. In the above example, assume that the full name is "Trandopholus, Marie L." The device recognizes the moment the comma has been struck that the surname is ended, and it thereafter registers only the first three digits of what would otherwise call for six digits. It therefore leaves the remaining three digits of the six digit mode to record the given name and middle initial. In the above example, "Marie" would generate two digits (fourth and fifth positions), and the activation of the space bar would open up the sixth position to record the middle initial "L." Thus, the name would translate to 98–37–96.

Conversely, a surname, by itself, may be capable of generating not more than two digits, for example "Tepper". Again, the device will discriminate between the components of the name according to punctuation and spaces between names and determine which and how many numeric code digits shall be accorded to each component of the name. Assume "Tepper, Cornelius J." The striking of the comma key will indicate that the surnace is ended, for which two digits (positions 1 and 2) were used. "Cornelius", which by itself would generate a five digit code leaving nothing for the middle name, is automatically accorded code position 3 (not used by the surname) and code positions 4 and 5, the use of the space bar between "Cornelius" and "J." having indicated the presence of a middle initial for which the sixth position has therefore been reserved. Thus, the name would translate to 19–29–85.

In treating a name of three components as one single entity, the device achieves maximum uniqueness by registering code digits for each component on the basis of how the accompanying components contribute to the making of a full name.

Thus, the name "Cornelius", translated by the device would be 29–86–0, a five digit code. However, the translation of "Cornelius", in order to achieve maximum uniqueness in the ultimate code as well as to capture within the six allowable code digits the significant components of the full name, will vary in accordance with the presence or absence of a preceding name-component, and in accordance with the specific structure of such component.

As stated, "Cornelius" by itself and according to the present system is a five digit translation 29–86–0. Note, however, the code variations of "Cornelius" as produced by the device when "Cornelius" is related to its preceding name-component:

| FULL NAME | COMPONENTS PRECEDING | "CORNELIUS" ENCODING |
|---|---|---|
| Cornelius, James F. | None | 98–6 |
| Lee, Cornelius | One | 29–86–0 |
| Ladd, Cornelius | One | 29–86 |
| Lang, Cornelius | One | 29–8 |
| Langen, Cornelius | One | 29 |
| Langen, James Cornelius | Two | 2 |

In some case, the total components of a name may not require all six code positions. For example, in encoding the name "Bell, Dora S.", the comma key will indicate the end of the surname, which produces one digit in position one, and also indicates the start of the given name "Dora" which produces two digits in positions 2 and 3. The space bar will indicate the end of the given name and the start of the middle name, the latter producing one digit in position four. Thus, the resultant code is 63–90.

I wish it to be understood that I do not consider the invention limited to the precise details of structure disclosed herein, for obvious modifications will occur to those skilled in the art to which the invention pertains.

I claim:

1. An encoding device for translating an input in the form of known alphabetic components of a name into an alpha-numeric code in which the word is divided into phonic sounds, and assigned a decimal number in accordance with a pre-established pattern classifying the phonic sounds by the manner in which they are vocally pronounced comprising: a keyboard element including keys corresponding to the alphabet, comma and space bar; numerical signal generating means connected to said keyboard element, and generating numerical values ranging from zero to nine; the keys of said keyboard designating consonants being connected in sets to said signal generating means in accordance with said pattern; logic signal generating means for generating spacing, grouping, length of word and length of code function, the keys designating vowels, comma and space bar being connected to said signal generating means, and means for processing and displaying the outputs of said numerical and signal generating means; whereby using a predetermined maximum number of display digits, actuation of said comma and space bar keys determines the completion of insertion of first, middle and surname components and causes accounting of the same to employ available code positions to reflect each known component of an inserted name in the resultant code.

2. Structure in accordance with claim 1, including decimal to binary convertor means, binary decoder means, and means including said predetermined maximum number of digits for displaying the output of said decoder means.

* * * * *